(12) United States Patent
Lu et al.

(10) Patent No.: US 9,448,491 B2
(45) Date of Patent: Sep. 20, 2016

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsin-Chu (TW); Jeng-Horng Chen, Hsin-Chu (TW); Anthony Yen, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 348 days.

(21) Appl. No.: 14/032,457

(22) Filed: Sep. 20, 2013

(65) Prior Publication Data

US 2015/0085268 A1    Mar. 26, 2015

(51) Int. Cl.
*G03B 27/52*   (2006.01)
*G03F 7/20*    (2006.01)
*G03F 1/24*    (2012.01)
*G03F 1/48*    (2012.01)

(52) U.S. Cl.
CPC ............... *G03F 7/702* (2013.01); *G03F 1/24* (2013.01); *G03F 1/48* (2013.01)

(58) Field of Classification Search
CPC ............ G03F 7/702; G03F 1/24; G03F 1/48; G03F 7/70116; G03F 7/70958; G03F 7/70316; G03F 7/2002; G03F 1/22; G03F 7/20; G03F 1/26; G03F 7/70308; G03F 7/70575; G03F 1/30; G03F 1/32; G03F 7/00; G03F 7/70283; G02B 26/0833
See application file for complete search history.

(56) References Cited

U.S. PATENT DOCUMENTS

| | | | |
|---|---|---|---|
| 2005/0084768 A1* | 4/2005 | Han | B82Y 10/00 430/5 |
| 2008/0318139 A1* | 12/2008 | Dersch | B82Y 10/00 430/5 |
| 2011/0117479 A1* | 5/2011 | Suga | B82Y 10/00 430/5 |
| 2013/0236818 A1* | 9/2013 | Lee | G03F 1/24 430/5 |

* cited by examiner

*Primary Examiner* — Mesfin T Asfaw
(74) *Attorney, Agent, or Firm* — Haynes and Boone, LLP

(57) ABSTRACT

A system of an extreme ultraviolet lithography (EUVL) is disclosed. an extreme ultraviolet lithography (EUVL) system includes an extreme ultraviolet (EUV) reflection-type mask having a patterned flare-suppressing-by-phase-shifting (FSbPhS) layer disposed over a patterned absorption layer. The system also includes a radiation to expose the EUV mask and a projection optics box (POB) to collect and direct the radiation that reflects from the EUV mask to expose a target.

20 Claims, 5 Drawing Sheets

US 9,448,491 B2

EXTREME ULTRAVIOLET LITHOGRAPHY PROCESS AND MASK

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. High resolution lithography processes are often one of the more important areas to decreasing feature size, and improvements in this area are generally desired. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is very similar to optical lithography in that it uses a mask to print wafers. However, unlike optical lithography, EUV employs light in the EUV region, e.g., at about 13.5 nm. At the wavelength of 13.5 nm, most materials are highly absorbing. Thus, reflective optics, rather than refractive optics, are used in EUV lithography. Although existing methods of EUV lithography have been generally adequate for their intended purposes, they have not been entirely satisfactory in all respects. For example, the EUV light produced by tin plasma, such as DPP (discharge-produced plasma) and LPP (laser-produced plasma), emits some out of band (OOB) radiation. An OOB radiation is a radiation with an wavelength which is out of a pre-determined wavelength band centered on a pre-determined wavelength, such as a 2% band centered on 13.5 nm. A portion of the OOB radiation (sometimes referred to as a flare) can also arrive at the target substrate (e.g., a wafer) and cause image contrast loss. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
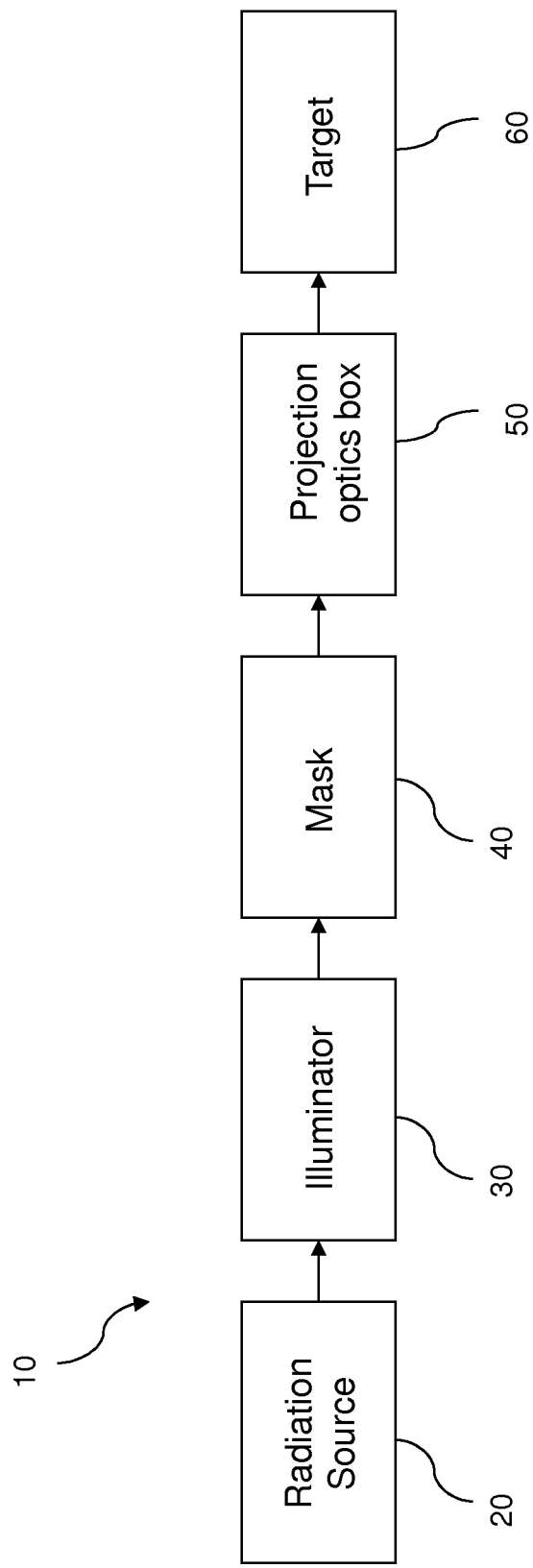
FIG. 1 is a block diagram of a lithography process for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present invention is disclosed. The EUV lithography process 10 employs an EUV radiation source 20 having a wavelength of about 1-100 nm, including an EUV wavelength of about 13.5 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask 40. In the EUV wavelength range, reflective optics is employed generally. Refractive optics, however, can also be used in some cases as zoneplates. In various embodiments, the illuminator 30 is set up to illuminate a mask 40 with a chief ray angle from 4 to 10 degrees.

The EUV lithography process 10 also employs a mask 40 (the terms mask, photomask, and reticle are used herein to refer to the same item). In the present embodiment, the mask 40 is a reflective mask. The mask 40 may incorporate other resolution enhancement techniques such as optical proximity correction (OPC). The mask 40 will be described in further detail later.

The lithography process 10 also employs optics, generally referred to as a projection optics box (POB) 50. The POB 50 may have refractive optics or reflective optics. The radiation reflected from the mask 40 (e.g., a patterned radiation) may be reduced and redirected by the POB 50 to expose a target 60.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto different areas of the target substrate in a repetitive fashion (though other lithography methods are possible).

The EUV exposure light source may contain some of out of band (OOB) radiation and a part of the OOB radiation can arrival wafer surface (sometimes referred to as a flare) and causes image contrast loss. For example, an OOB radiation is a radiation with a wavelength which is out of a 2% band centered on 13.5 nm. To suppress OOB, several techniques have been developed. One of current common techniques is using a top-coating upon photoresist which can absorb OOB light. However, the top-coating usually absorbs EUV light as well and it may have a negative impact on lithography performance and process throughput. Meanwhile this additional top-coating may also increase manufacture cost. Another one of current common techniques is to use a filter to filter out the OOB radiation. In order to preserve EUV light and lithography performance, the filter usually need to be made very thin and uniform, a durability and cost of the filter, as well as EUV light loss, raise challenges. A new method of suppressing OOB flare, such as a DUV flare (having wavelength form 100 nm to 350 nm), by a mask structure is described below according to various embodiments of the present disclosure.

The following description refers to the mask 40 and a mask fabrication process. The mask fabrication process usually includes two steps: a mask substrate fabrication process and a mask substrate patterning process. During the mask substrate fabrication process, a mask substrate is formed by depositing suitable layers (e.g., multiple reflective layers) on a suitable material layer. The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Many masks (for example, more than 15 or more than 30 masks) may be used to construct a complete IC device.

Figure 2:
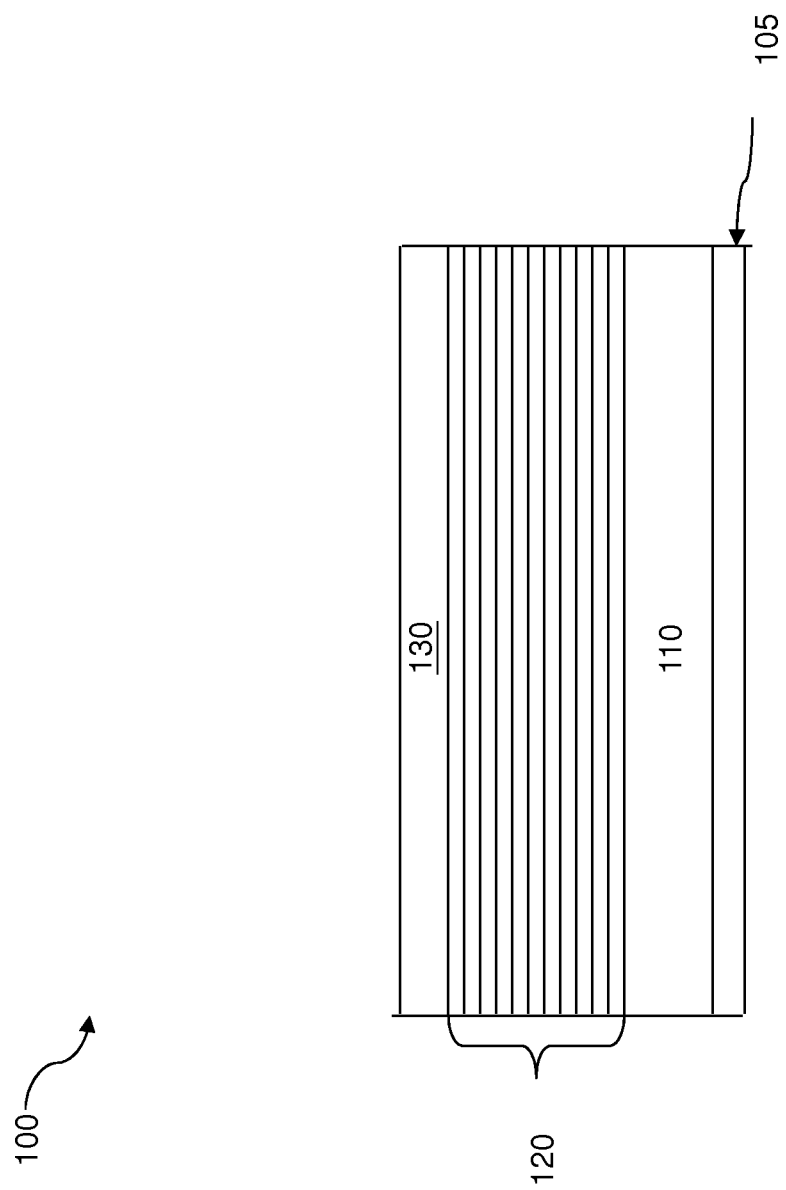
FIGS. 2 and 3 are diagrammatic cross-sectional views of various aspects of one embodiment of a blank mask at various stages of a lithography process constructed according to aspects of the present disclosure.

Referring to FIG. 2, a EUV mask substrate 100 includes a material layer 110 made of low thermal expansion material (LTEM). The LTEM includes $TiO_2$, doped $SiO_2$, and/or other low thermal expansion materials known in the art. The LTEM layer 110 serves to minimize image distortion due to mask heating. In the present embodiment, the LTEM layer 110 includes materials with a low defect level and a smooth surface. In addition, a conductive layer 105 may be disposed under (as shown in the figure) the LTEM layer 110 for electrostatic chucking purpose. In an embodiment, the conductive layer 105 includes chromium nitride (CrN), though other compositions are possible.

The EUV mask substrate 100 also includes a reflective multilayer (ML) 120 deposed over the LTEM layer 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let light reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any material that is highly reflective at EUV wavelengths can be utilized for the reflective ML 120. The thickness of each layer of the reflective ML 120 depends on the EUV wavelength and the incident angle. The thickness of the reflective ML 120 is adjusted to achieve a maximum constructive interference of the EUV light reflected at each interface and a minimum absorption of the EUV light by the reflective ML 120. The reflective ML 120 may be selected such that it provides a high reflectivity to a selected radiation type/wavelength. A typical number of film pairs is 20-80, however any number of film pairs is possible. The reflective ML 120 usually achieves a reflectance of 0.65 or above. In an embodiment, the reflective ML 120 includes forty pairs of layers of Mo/Si. Each Mo/Si film pair has a thickness of about 7 nm, with a total thickness of 280 nm. In one case, a reflectivity of about 70% is achieved.

The EUV mask substrate 100 may also include a capping layer 130 disposed above the reflective ML 120 to prevent oxidation of the reflective ML. In one embodiment, the capping layer 130 includes ruthenium (Ru), Ru compounds such as RuB, RuSi, chromium (Cr), Cr oxide, and Cr nitride.

One or more of the layers 105, 120 and 130 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Figure 3:
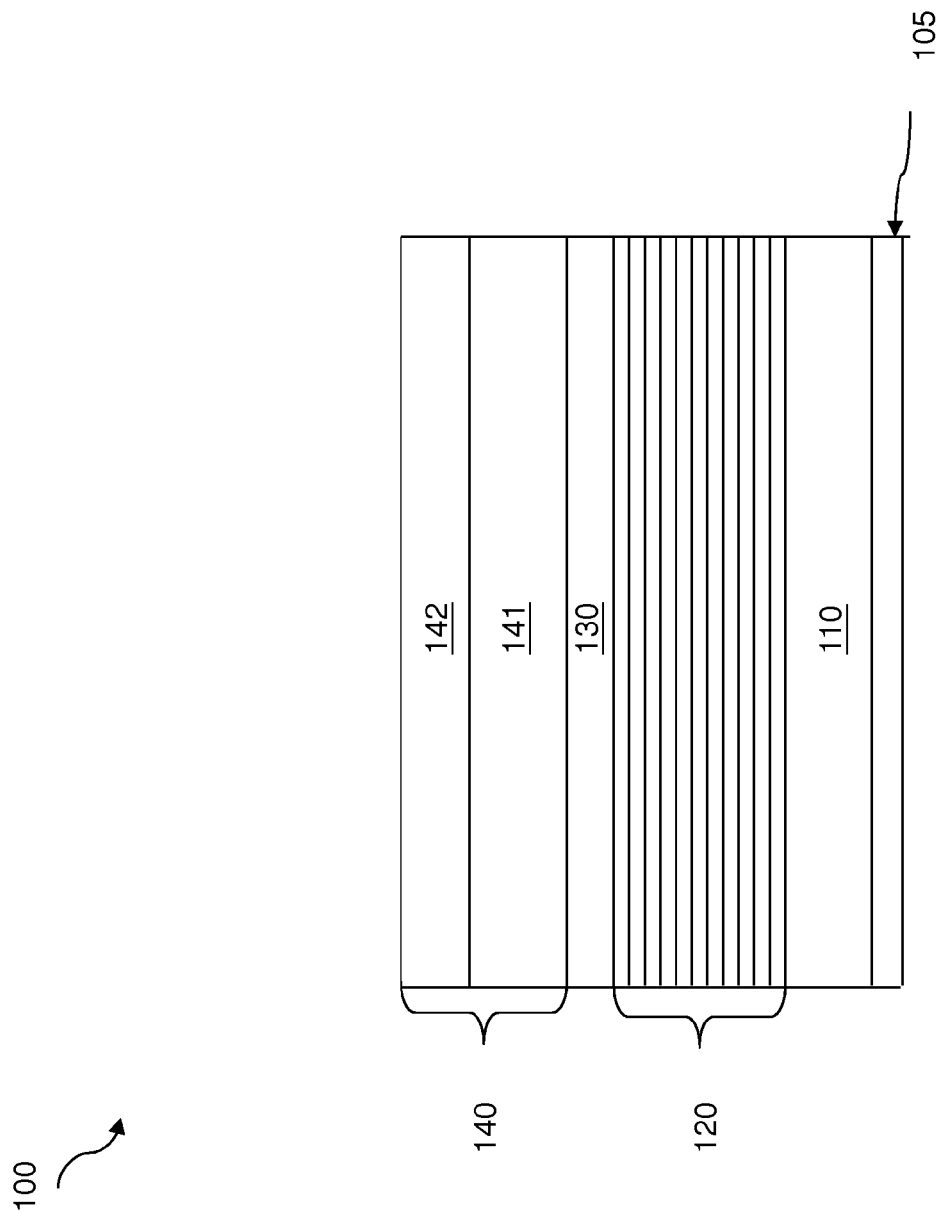

Referring to FIG. 3, a flare-suppressing absorption stack (FSAS) 140 is formed over the capping layer 130. The FSAS 140 includes an absorption layer 141 deposited over the capping layer 130 and a flare-suppressing-by-phase-shifting (FSbPhS) layer 142 deposited over the absorption layer 141. The absorption layer 141 absorbs radiation in the EUV wavelength range projected onto the mask substrate 100. The absorption layer 141 may include a single, or multiple film layers, from a group consisting of tantalum (Ta), tantalum boron nitride (TaBN), tantalum, titanium, or aluminum-copper, palladium, tantalum nitride, aluminum oxide, molybdenum (Mo), or other suitable materials.

In the present embodiment, the FSbPhS layer 142 is designed to be transparent for EUV light and reflect a light having a predetermined wavelength range, such as deep ultra-violet (DUV). The FSbPhS layer 142 provides a phase-shifting operation on the reflected light to form a destructive interference between lights having predetermined wavelength reflected from two different regions in the EUV mask 200 (described in more detail below). The FSbPhS layer 142 may include a single, or multiple film layers, from a group consisting of silicon (Si), phosphorus (P), beryllium (Be) and their compounds. The FSAS 140 may be deposited by any suitable processes, such as PVD, CVD, MOD and spin-on coating.

Figure 4:
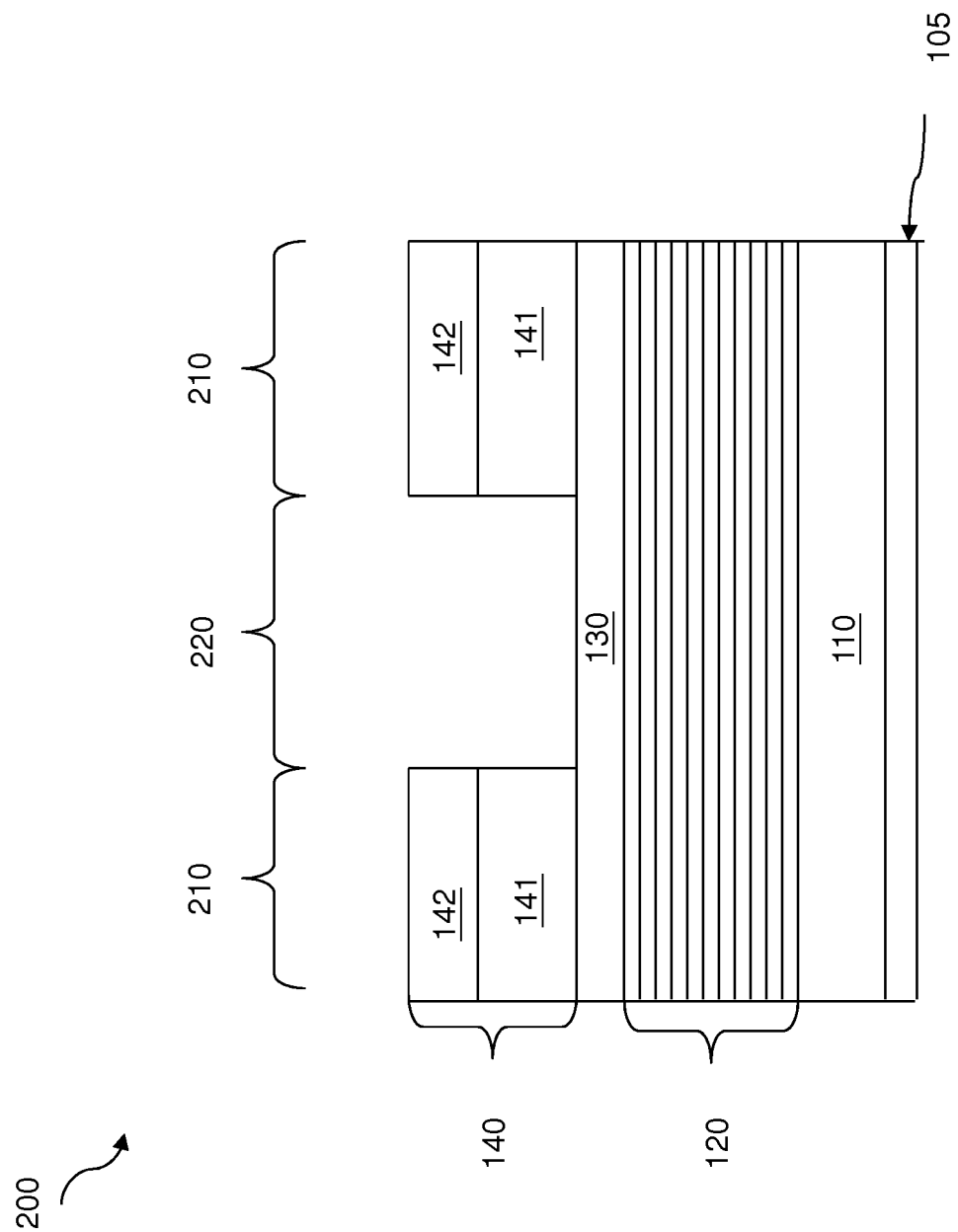
FIG. 4 is a diagrammatic cross-sectional view of various aspects of one embodiment of an EUV mask at various stages of a lithography process constructed according to aspects of the present disclosure.

Referring to FIG. 4, the FSAS 140 is patterned to form the design layout pattern EUV mask 200 with two regions, an absorptive region 210 and a reflective region 220, on the mask (now identified as mask 200). The FSAS 140 remains in the absorption region 210 and is removed in the reflective region 220. The patterned FSAS 140 may be formed by various patterning processes. For example, a patterning process may include resist coating (e.g., spin-on coating), soft baking, mask aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing. An etching process is performed next to remove the FSAS 140 in the reflective region 220. The etching process may include dry (plasma) etching, wet etching, and/or other etching methods.

In the present embodiment, the thicknesses of the absorption layer 141 and the FSbPhS layer 142 are chosen to correspond with the materials used in the layers, as would be straightforward to calculate by one or ordinary skill in the art. In this way, the FSAS 140 is configured such that it absorbs the EUV light and reflects an OOB flare in a predetermined wavelength range, such as DUV flare (having wavelength from 100 nm to 350 nm), with an about 180-degree phase shift between the absorptive region 210 and the reflective region 220. Therefore a destructive interference is formed to suppress a substantial portion of the OOB flare having predetermined wavelength. For example, with the FSAS 140 having a 70 nm TaBN absorption layer 141 and a 70 nm Si FSPhS layer 142, more than 50% of 193 nm DUV flare is suppressed. For another example, with the FSAS 140 having a 30 nm TaBN absorption layer 141 and a 20 nm Si FSbPhS layer 142, more than 50% of 193 nm DUV flare is suppressed.

Figure 5:
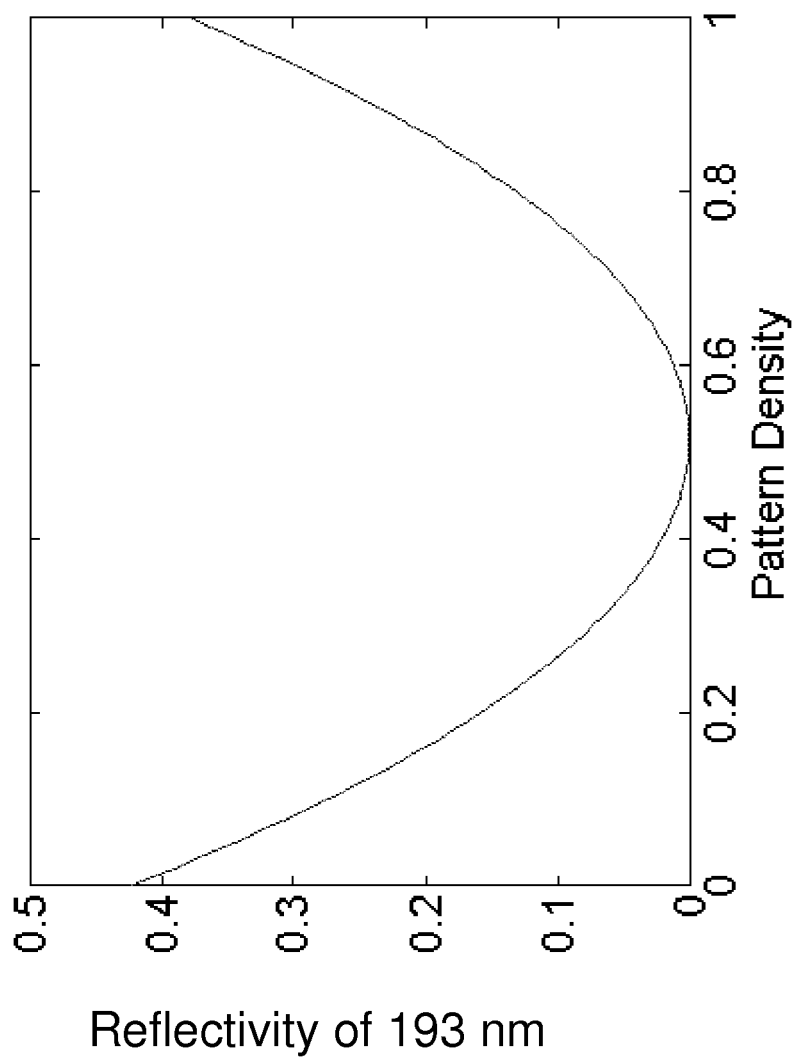
FIG. 5 is a diagram illustrating reflectivity vs. pattern density of a mask constructed according to one embodiment.

Reflectivity of the predetermined wavelength may also vary with pattern density of the mask 200. As an example, a chart of reflectivity of 193 nm light vs. pattern density of a mask having a patterned FSAS is shown in FIG. 5. A lowest reflectivity of 193 nm light is shown at near 0.5 pattern density. Thus pattern density will be considered when designing the FSAS 140.

In the present embodiment, the EUV mask 200 has main patterns, which represent circuit patterns, and sub-resolution patterns, which are not printed on the wafer. The sub-resolution patterns can be located next to main patterns.

The EUV mask 200 may also incorporate other resolution enhancement techniques such as an optical proximity correction (OPC). The mask 200 may undergo a defect repair process by a mask defect repair system. The mask defect repair system is a suitable system, such as an e-beam repair system and/or a focused ion beam (FIB) repair system.

Based on the above, the present disclosure offers the EUV lithography system and process employing an EUV mask having a built-in flare-suppression function. The EUV lithography system and process demonstrates an enhancement of aerial image contrast and improvement of lithography performance.

The present disclosure is directed towards lithography systems and processes. In one embodiment, an extreme ultraviolet lithography (EUVL) system includes an extreme ultraviolet (EUV) reflection-type mask. The EUV mask includes a substrate, a multilayer mirror disposed over the substrate, a capping layer disposed over the multilayer mirror, a patterned absorption layer disposed over the capping layer. The patterned absorption layer defines a pattern density. The system also includes a patterned flare-suppressing-by-phase-shifting (FSbPhS) layer disposed over the patterned absorption layer. Materials and thicknesses of the patterned absorber layer and the patterned FSbPhS layer are such that a substantial portion of a first radiation wave of a pre-determined wavelength that reflects from the patterned FSbPhS layer in an out-of-phase relationship with a second radiation wave of the pre-determined wave length that reflects from the multilayer mirror. The system also includes a radiation to expose the EUV mask and a projection optics box (POB) to collect and direct the radiation that reflects from the EUV mask to expose a target.

In another embodiment, an extreme ultraviolet lithography (EUVL) process to suppress deep ultraviolet (DUV) flare level. The process includes providing a radiation having EUV and DUV lights, directing the radiation to a mask, reflecting a portion of the EUV and DUV light from a reflective region of the mask, absorbing a portion of the EUV light in an absorptive region of the mask, destructively interfering the portion of DUV light reflected from the reflective region with another portion of the DUV light reflected from the absorptive region and has 180 degrees out of phase from a flare-suppressing-by-phase-shifting (FSbPhS) layer in the absorptive region of the mask. The process also includes directing reflected light to a target.

The present disclosure is also directed towards masks. In one embodiment, the mask for extreme ultraviolet lithography (EUVL) includes a low thermal expansion material (LTEM) substrate, a reflective multilayer (ML) over the LTEM substrate, a capping layer over the ML and a patterned flare-suppressing absorption stack (FSAS) over the capping layer. The patterned FSAS includes a patterned absorption layer deposited over the capping layer and a patterned flare-suppressing-by-phase-shifting (FSbPhS) layer deposited over the patterned absorption layer.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) system comprising:
   an extreme ultraviolet (EUV) reflection-type mask, including:
   a substrate;
   a multilayer mirror disposed over the substrate;
   a capping layer disposed over the multilayer mirror;
   a patterned absorption layer disposed over the capping layer, wherein the patterned absorption layer defines a pattern density;
   a patterned flare-suppressing-by-phase-shifting (FSbPhS) layer disposed over the patterned absorption layer, wherein a material and thickness of the patterned absorber layer and the patterned FSbPhS layer are such that a substantial portion of a first radiation wave of a pre-determined wavelength that reflects from the patterned FSbPhS layer in an out-of-phase relationship with a second radiation wave of the pre-determined wave length that reflects from the multilayer mirror, wherein a trench extends through the patterned FSbPhS layer and the patterned absorption layer to the capping layer such that a top surface of the capping layer is exposed within the trench, the top surface of the capping layer facing away from the substrate;
   a radiation source to generate a radiation to expose the EUV mask; and a projection optics box (POB) to collect and direct the radiation that reflects from the EUV mask to expose a target.

2. The system of claim 1, wherein the pre-determined wavelength is a deep ultraviolet (DUV) wavelength in a range from about 100 nm to about 350 nm.

3. The system of claim 1, wherein the patterned absorption layer includes tantalum boron nitride (TaBN) layer and has a thickness of about 70 nm and the patterned FSbPhS layer includes silicon (Si) and has a thickness of about 70 nm.

4. The system of claim 3, wherein the patterned absorption layer includes tantalum boron nitride (TaBN) layer with a thickness of about 30 nm and the patterned FSbPhS layer includes silicon (Si) layer with a thickness of about 20 nm.

5. The system of claim 1, wherein the patterned FSbPhS layer is formed by a material selected from a group consisting of silicon (Si), phosphorus (P), beryllium (Be) and their compounds.

6. The system of claim 1, wherein a light having the pre-determined wavelength in the radiation has a substantial low reflectivity corresponding with the pattern density of the EUV mask.

7. An extreme ultraviolet (EUV) mask, comprising:
a low thermal expansion material (LTEM) substrate;
a reflective multilayer (ML) over the LTEM substrate;
a capping layer over the ML; and
a patterned flare-suppressing absorption stack (FSAS) over the capping layer, wherein the patterned FSAS includes a patterned absorption layer deposited over the capping layer and a patterned flare-suppressing-by-phase-shifting (FSbPhS) layer disposed over the patterned absorption layer, wherein a trench extends through the patterned FSbPhS layer and the patterned absorption layer to the capping layer such that a top surface of the capping layer is exposed within the trench, the top surface of the capping layer facing away from the substrate.

8. The mask of claim 7, wherein the patterned absorption layer includes materials from a group consisting of tantalum (Ta), tantalum boron nitride (TaBN), tantalum, titanium, or aluminum-copper, palladium, tantalum nitride, aluminum oxide and molybdenum (Mo).

9. The mask of claim 7, wherein the patterned FSbPhS layer includes a material selected from a group consisting of silicon (Si), phosphorus (P), beryllium (Be) and their compounds.

10. The mask of claim 7, wherein the patterned FSAS includes a patterned tantalum boron nitride (TaBN) absorption layer and the patterned silicon (Si) FSbPhS layer.

11. The mask of claim 10, wherein the patterned absorption layer has a thickness of about 70 nm and the patterned FSbPhS layer has a thickness of about 70 nm.

12. The mask of claim 10, wherein the patterned absorption layer has a thickness of about 30 nm and the patterned FSbPhS layer has a thickness of about 20 nm.

13. The mask of claim 7, wherein the capping layer includes ruthenium (Ru) and Ru compounds.

14. The mask of claim 13, wherein the capping layer has a thickness of about 2.5 nm.

15. The mask of claim 7, further comprising:
main patterns; and
sub-resolution patterns located next to main patterns.

16. An extreme ultraviolet lithography (EUVL) method comprising:
providing a radiation having EUV and DUV lights;
directing the radiation to a mask, the mask including:
a reflective region;
a capping layer over the reflective region; and
a flare-suppressing absorption stack (FSAS) over the capping layer, wherein the FSAS includes an absorptive region deposited over the capping layer and a flare-suppressing-by-phase-shifting (FSbPhS) layer disposed over the absorptive region, wherein a trench extends through the FSbPhS layer and the absorptive region to the capping layer such that a top surface of the capping layer is exposed within the trench, the top surface of the capping layer facing away from the reflective region;
reflecting a portion of the EUV and DUV light from the reflective region of the mask;
absorbing a portion of the EUV light in the absorptive region of the mask;
destructively interfering with the portion of DUV light reflected from the reflective region by reflecting a portion of the DUV light 180 degrees out of phase from the FSbPhS layer in the absorptive region of the mask; and
directing reflected light to a target.

17. The method of claim 16, wherein a substantial portion of the DUV light is suppressed by a destructive interference.

18. The method of claim 17, wherein the destructive interference is formed between two portions of the DUV light: one portion is reflected from the absorptive region, having an about 70 nm tantalum boron nitride (TaBN) layer and an about 70 nm silicon (Si) FSbPhS layer, and the another portion is reflected from the reflective region.

19. The method of claim 17, wherein, the destructive interference is formed between two portions of the DUV light: one portion is reflected from the absorptive region, having an about 30 nm tantalum boron nitride (TaBN) layer and an about 20 nm silicon (Si) FSbPhS layer, and the another portion is reflected from the reflective region.

20. The method of claim 16, wherein the FSbPhS layer is formed by depositing a material, selected from a group consisting of silicon (Si), phosphorus (P), beryllium (Be) and their compounds, over the absorptive region.

* * * * *